(12) United States Patent
Balster et al.

(10) Patent No.: US 8,847,359 B2
(45) Date of Patent: Sep. 30, 2014

(54) HIGH VOLTAGE BIPOLAR TRANSISTOR AND METHOD OF FABRICATION

(75) Inventors: Scott Gerard Balster, Dallas, TX (US); Hiroshi Yasuda, Plano, TX (US); Philipp Steinmann, Richardson, TX (US); Badih El-Kareh, Cedar Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1358 days.

(21) Appl. No.: 12/537,246

(22) Filed: Aug. 6, 2009

(65) Prior Publication Data

US 2010/0032804 A1 Feb. 11, 2010

Related U.S. Application Data

(60) Provisional application No. 61/086,493, filed on Aug. 6, 2008.

(51) Int. Cl.
| | |
|---|---|
| H01L 21/331 | (2006.01) |
| H01L 29/73 | (2006.01) |
| H01L 29/66 | (2006.01) |
| H01L 21/762 | (2006.01) |
| H01L 29/737 | (2006.01) |
| H01L 29/732 | (2006.01) |
| H01L 29/161 | (2006.01) |
| H01L 29/10 | (2006.01) |

(52) U.S. Cl.
CPC ...... H01L 29/7378 (2013.01); H01L 29/66242 (2013.01); H01L 21/76283 (2013.01); H01L 29/732 (2013.01); H01L 29/161 (2013.01); H01L 29/66234 (2013.01); H01L 29/1004 (2013.01)
USPC 257/586; 257/535; 257/E21.37; 257/E21.372; 257/E29.174

(58) Field of Classification Search
USPC .............. 257/586, E21.37, E29.174; 438/341
See application file for complete search history.

(56) References Cited

U.S. PATENT DOCUMENTS

2002/0160562 A1* 10/2002 Babcock et al. ............. 438/207
2009/0159968 A1* 6/2009 Merchant et al. ............ 257/337

* cited by examiner

*Primary Examiner* — Ori Nadav
*Assistant Examiner* — Vernon P Webb
(74) *Attorney, Agent, or Firm* — Alan A. R. Cooper; Frederick J. Telecky, Jr.

(57) ABSTRACT

High voltage bipolar transistors built with a BiCMOS process sequence exhibit reduced gain at high current densities due to the Kirk effect. Threshold current density for the onset of the Kirk effect is reduced by the lower doping density required for high voltage operation. The widened base region at high collector current densities due to the Kirk effect extends laterally into a region with a high density of recombination sites, resulting in an increase in base current and drop in the gain. The instant invention provides a bipolar transistor in an IC with an extended unsilicided base extrinsic region in a configuration that does not significantly increase a base-emitter capacitance. Lateral extension of the base extrinsic region may be accomplished using a silicide block layer, or an extended region of the emitter-base dielectric layer. A method of fabricating an IC with the inventive bipolar transistor is also disclosed.

15 Claims, 12 Drawing Sheets

HIGH VOLTAGE BIPOLAR TRANSISTOR AND METHOD OF FABRICATION

This is a non-provisional of Application No. 61/086,493 filed Aug. 6, 2009, the entirety of which is incorporated herein by reference.

BACKGROUND

This invention relates to the field of integrated circuits; and, more particularly, to integrated circuits and the fabrication of integrated circuits including high voltage bipolar transistors.

Bipolar transistors operating at high collector current densities are subject to the Kirk effect, in which the majority carrier charge density associated with the current injected into the collector is equal to the ionized impurity charge density in the collector depletion region, thereby widening the effective base region. Bipolar transistors designed to operate at high voltages (for example, collector-emitter voltages greater than 30 volts) require lower doping densities in the collectors (in the $10^{14}$ to $10^{15}$ cm$^{-3}$ range) compared to bipolar transistors designed to operate at less than 10 volts, in order to prevent breakdown of the base-collector junctions. The lower doping densities in the collectors reduce the threshold of collector current density for the onset of the Kirk effect.

High voltage bipolar transistors in integrated circuits (ICs) are typically fabricated with a process sequence designed to fabricate a variety of components, including low voltage bipolar transistors and MOS transistors, at a minimum production cost and complexity. One result of integrating high voltage bipolar transistors into economical IC fabrication process sequences is that the widened base region at high collector current densities due to the Kirk effect extends laterally into a region with a high density of recombination sites, resulting in an increase in base current and an undesirable drop in the gain of the bipolar transistor. Increasing the lateral width of the emitter overlap of the base layer to remove the recombination site region from the collector current path results in an unacceptable increase in base-emitter capacitance.

SUMMARY

The invention provides a novel configuration and method of fabrication for an integrated circuit including a high voltage bipolar transistor.

In one implementation, a bipolar transistor is fabricated to have an extended base extrinsic region in a configuration that does not significantly increase a base-emitter capacitance, and which can operate at a high collector-emitter voltage (e.g., greater than 30 volts) at a constant gain at high collector current density. Lateral extension of the base extrinsic region may be accomplished using a silicide block layer, or an extended region of the emitter-base dielectric layer.

DETAILED DESCRIPTION OF EXAMPLE EMBODIMENTS

The principles of the invention are described with reference to an example implementation for fabricating a high voltage bipolar transistor, which can operate at a high collector-emitter voltage (e.g., greater than 30 volts) with a substantially constant gain at high collector current density. The described implementation provides a bipolar transistor with an extended base extrinsic region in a configuration that does not increase a base-emitter capacitance. It will be appreciated that the details given below relate to both NPN and PNP bipolar transistors, and that descriptions given in the context of one type of transistor may readily be applied to the other type of transistor by reversing polarities of dopants (i.e., changing n-type to p-type conductivity, and vice versa), as appropriate within the given context.

FIGS. 1A-1G illustrate steps in the fabrication of a bipolar transistor according to principles of the invention.

Figure 1A:
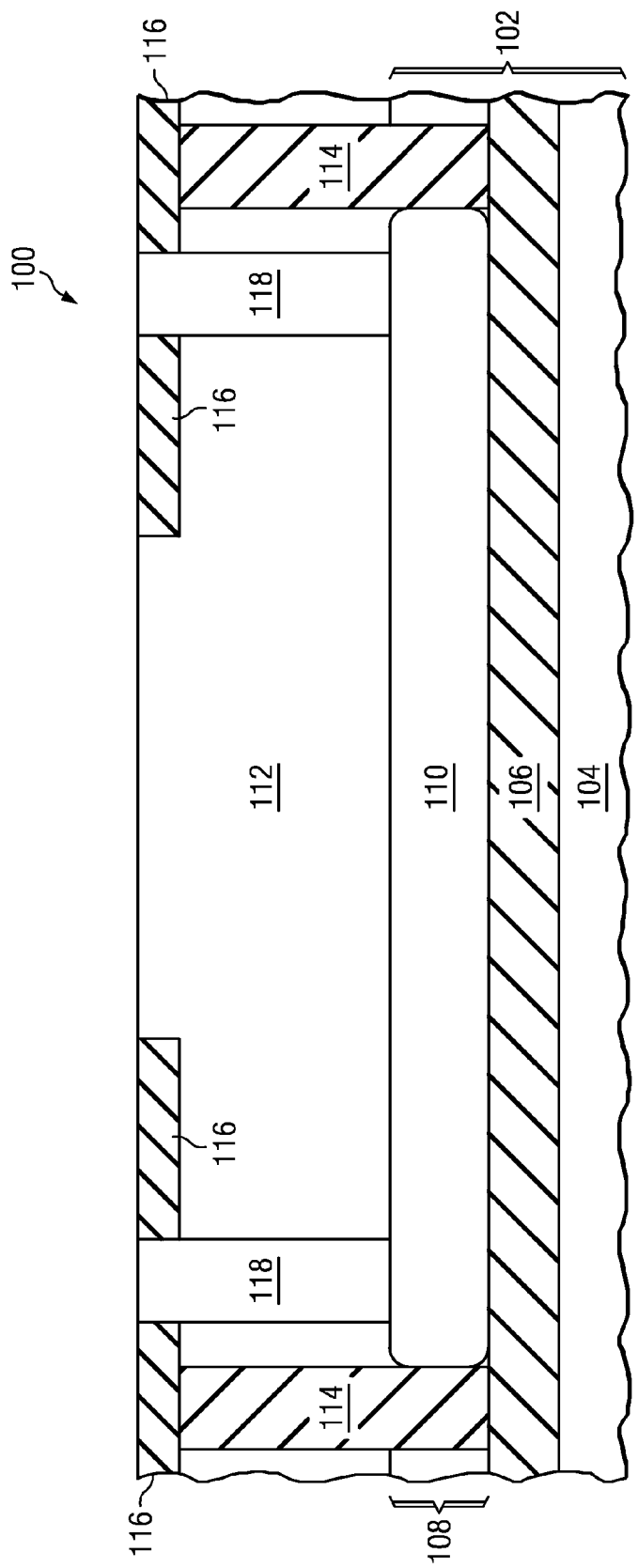
FIGS. 1A-1G are cross-sectional views of an integrated circuit (IC) including an example embodiment of a bipolar transistor fabricated in accordance with principles of the invention.

FIG. 1A shows an integrated circuit (IC) 100 including a bipolar transistor which may be fabricated on a starting wafer 102. Starting wafer 102 may, for example, be a commercially available wafer that includes a support wafer 104 (such as a single crystal p-type silicon with an electrical resistivity above 50 ohm-cm), a buried oxide layer 106 (such as a silicon dioxide layer between 0.1 and 2 microns thick) formed on the support wafer 104, and a silicon layer 108 (such as a single crystal silicon-on-insulator (SOI) film, 50 nanometers to 10 microns thick, with an electrical resistivity of between 1 and 100 ohm-cm) formed on the buried oxide layer 106. A portion of the silicon layer 108 may be removed by etching prior to forming components thereon. And, for the illustrated single crystal SOI film 108, more single crystal silicon or silicon-germanium may be grown over silicon layer 108 by epitaxial processes prior to forming the components. In another form, the starting wafer 102 may be a monolithic single crystal wafer.

Still referring to FIG. 1A, an n-type buried layer 110 is formed in the silicon layer, as by ion implantation of n-type dopants (e.g., phosphorus and arsenic dopants at doses of $10^{13}$ to $10^{16}$ atoms-cm$^{-2}$) into the SOI film 108 followed by an anneal and growth of an n-type epitaxial layer 112 to, e.g., 3 to 6 microns thick. A doping density of the n-type epitaxial layer 112 is determined by the intended operating voltage of the bipolar transistor. For example, an operating voltage of 36 volts between a collector and an emitter may be accommodated by a doping density in the n-type epitaxial layer 112 of $2\times10^{14}$ to $5\times10^{14}$ atoms-cm$^{-3}$ which can sustain the operating voltage across the base-collector junction without breaking down.

Still referring to FIG. 1A, fabrication of the IC 100 continues with formation of regions of deep trench isolation 114 in the n-type epitaxial layer 112 and SOI layer 108, containing an isolation material such as silicon dioxide and extending between a top surface of the n-type epitaxial layer 112 and the buried oxide layer 106, to electrically isolate buried layer 110 from other neighboring similar layers. Regions of field oxide 116, such as layers of silicon dioxide 250 to 600 nanometers deep, are formed in a top portion of the n-type epitaxial layer 112, such as by shallow trench isolation (STI) or local oxidation of silicon (LOCOS) processes, to further electrically isolate elements in the IC 100. Deep n-regions 118, commonly known as sinkers, are formed by multiple implantations of phosphorus and arsenic, followed by anneals, to connect the buried n-type layer 110 to a contacting top n-type layer formed in a subsequent step. While it will be appreciated that other configurations are possible, for simplicity the sinkers 118 are shown with rectangular cross section in FIG. 1A.

Figure 1B:
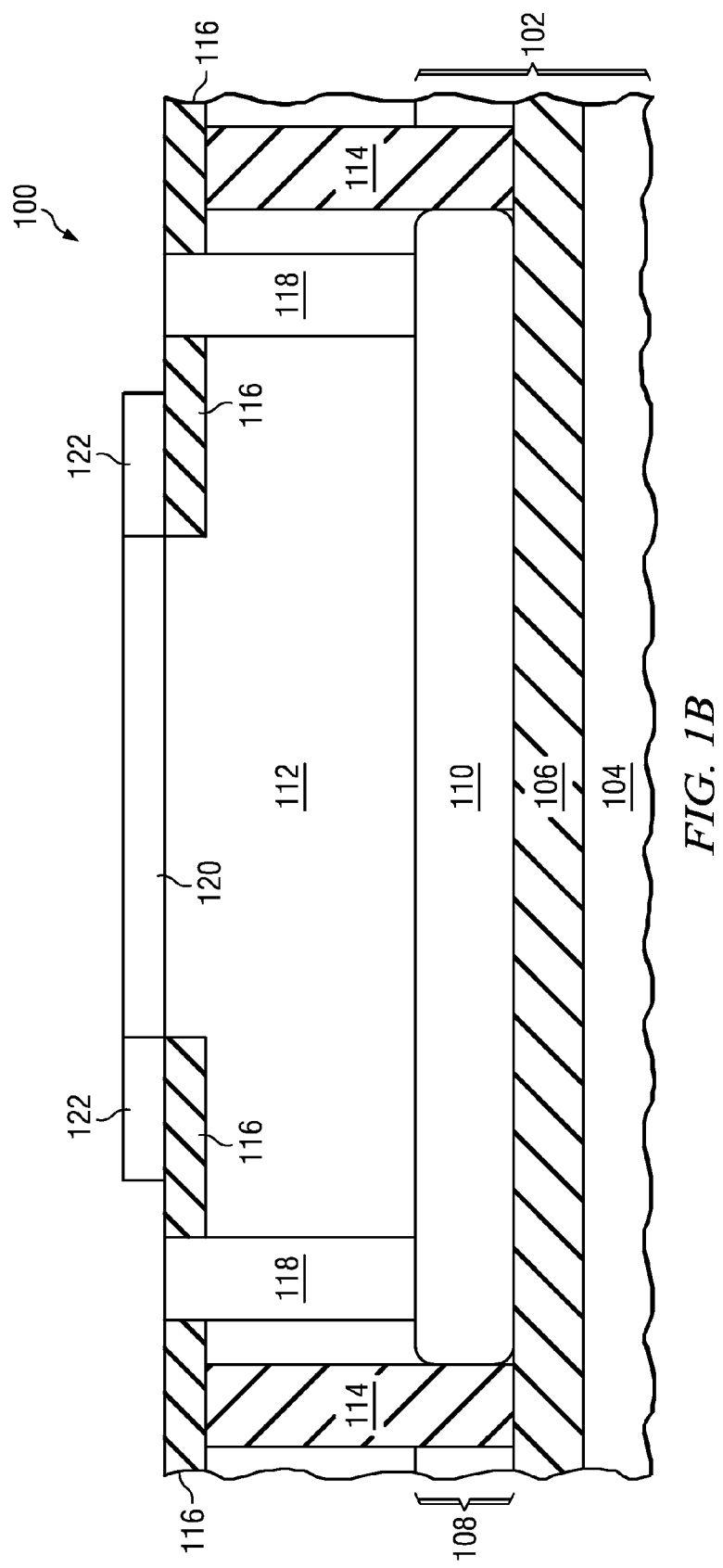

FIG. 1B depicts the IC 100 after formation of an epitaxial layer that constitutes the base of the bipolar transistor. A layer of silicon-germanium (SiGe) is formed on a top surface of the device 100, preferably by a non-selective epitaxial growth process, in which single crystal SiGe 120 is grown on the n-type epitaxial layer 112 while polycrystalline SiGe 122 is grown on a top surface of the field oxide 116. The SiGe layer is patterned with photoresist and etched to remove unwanted SiGe, for example, over the n-type sinkers 118. The SiGe is p-type doped to serve as a base for the bipolar transistor.

Figure 1C:
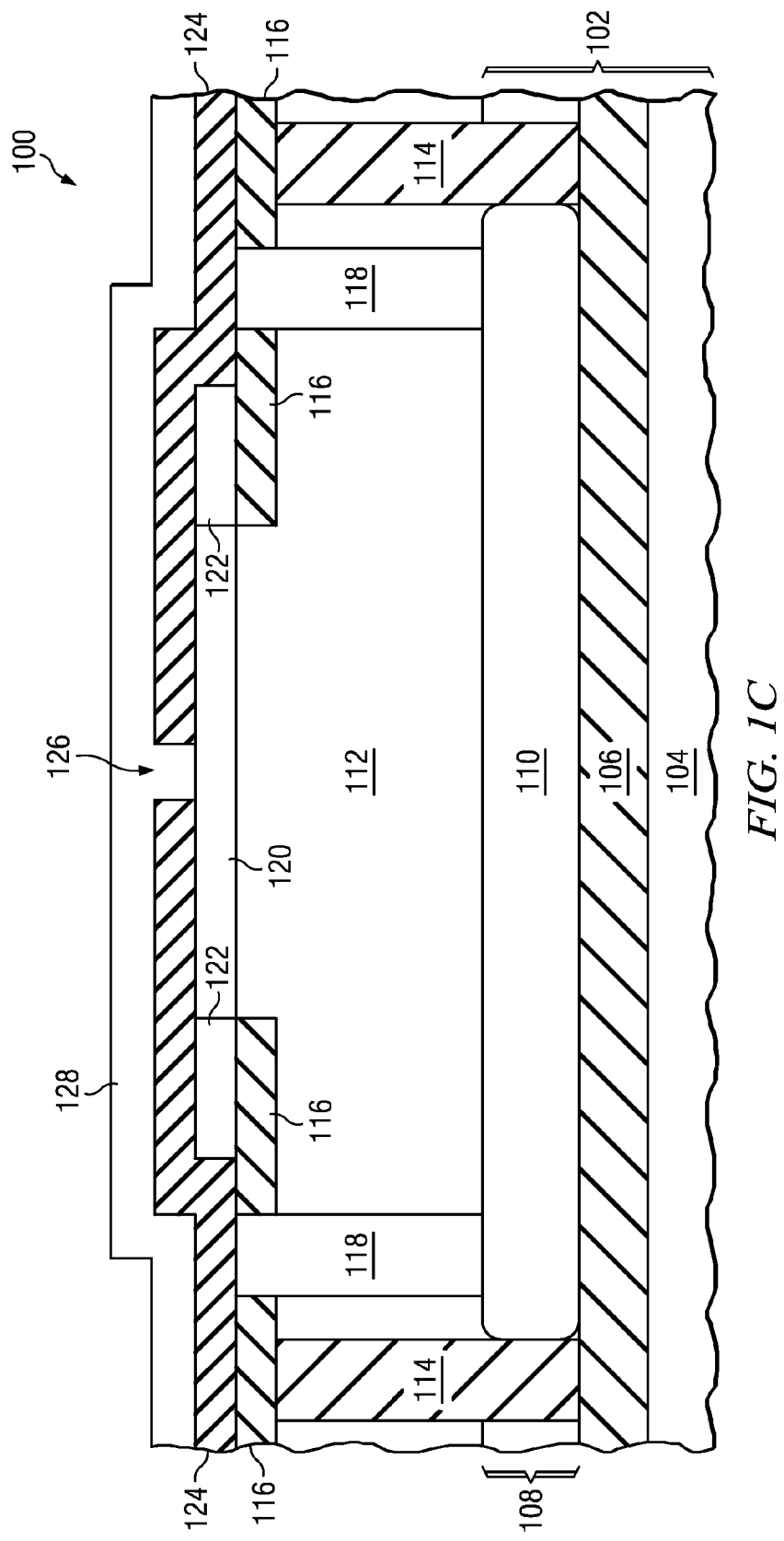

FIG. 1C depicts the IC 100 in a next phase of fabrication. An emitter-base dielectric stack 124, such as including layers of silicon dioxide and silicon nitride with a total thickness of between 100 and 300 nanometers, is formed on a top surface of the SiGe base layer 120. An emitter opening 126 is formed in the emitter-base dielectric stack 124 by defining a region for the emitter opening 126 with a photoresist pattern and etching the emitter-base dielectric stack material to expose the top surface of the single crystal SiGe layer 120. An n-type emitter silicon layer 128, e.g., of 50 to 250 nanometers thick, is formed in the emitter opening 126 and over the emitter-base dielectric stack 124. In some instances, there may be a thin interfacial oxide (IFO) film, e.g., 0.1 to 0.6 nanometers thick, on the top surface of the single crystal SiGe layer 120 in the emitter opening 126, causing the emitter silicon layer 128 to be formed as a polycrystalline silicon (i.e., polysilicon) layer. In other instances, the IFO is removed prior to formation of the emitter silicon layer 128, causing the emitter silicon layer 128 to be formed as a single crystal silicon layer.

Figure 1D:
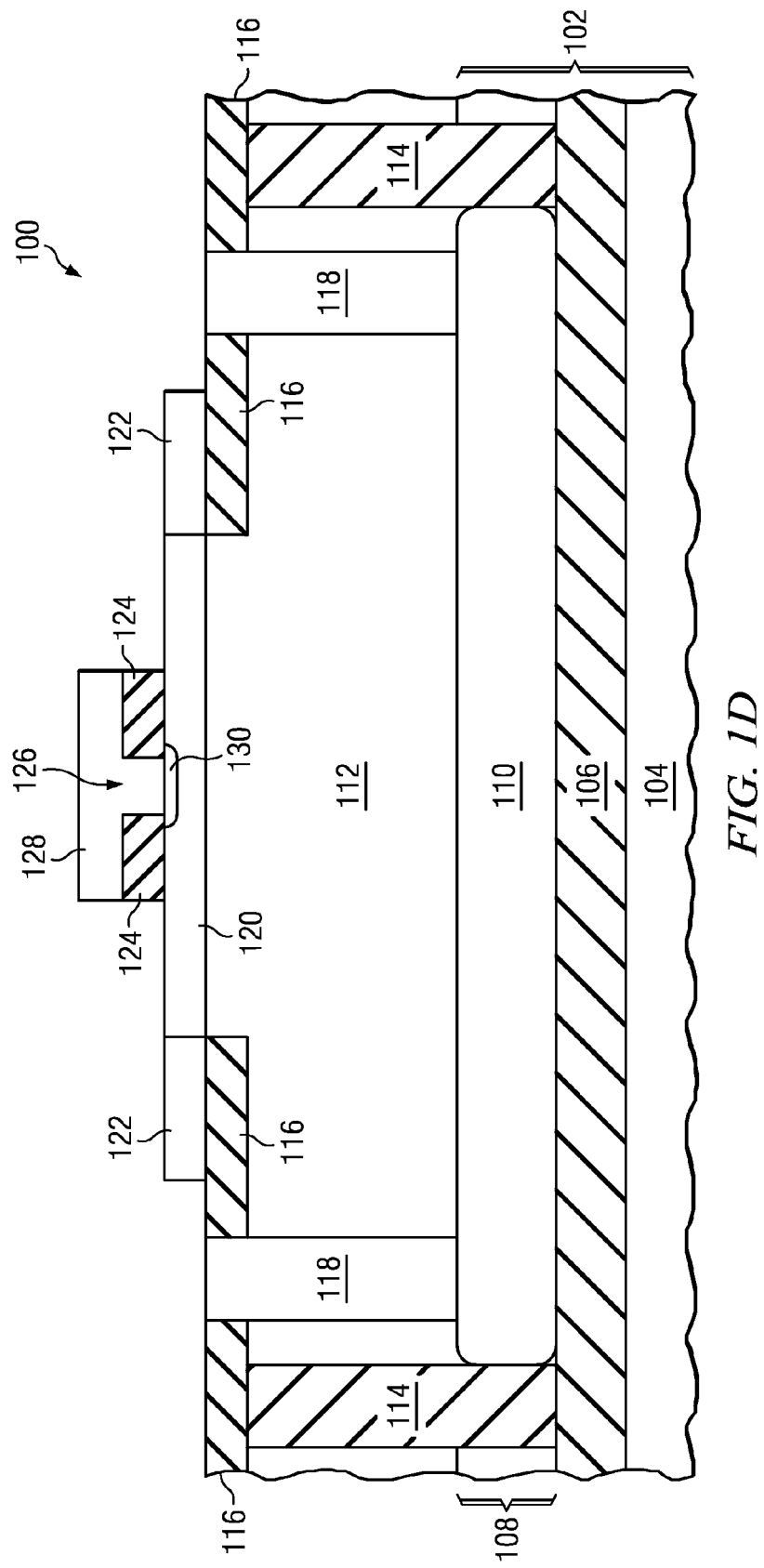

Referring to FIG. 1D, fabrication of the IC 100 continues with definition of an emitter silicon region by forming a photoresist layer on the emitter silicon layer 128 and etching to remove unwanted portions of the emitter silicon layer 128 and emitter-base dielectric stack 124. A minimum extent of lateral overlap of the emitter silicon layer 128 over the single crystal SiGe base layer 120 varies significantly depending on the fabrication technology node used and the operating characteristics of the IC 100. By way of example, a 36-volt NPN bipolar transistor may have an overlap of 400 to 500 nanometers. In this embodiment, lateral contours of the emitter silicon layer 128 and the emitter-base dielectric stack 124 are substantially the same. An n-type single crystal emitter region 130 is formed in the single crystal SiGe base layer 120 by performing a thermal process which causes n-type dopants from the emitter silicon layer 128 to diffuse into the single crystal SiGe base layer 120. In other embodiments, the thermal process to form the doped emitter region 130 may be performed at other points in the fabrication process sequence, including before the step of etching the emitter silicon layer 128. The regions of field oxide 116 and the doped emitter region 130 are configured such that lateral separation exists between the emitter region 130 and an interface between the SiGe base layer 120 and the polycrystalline SiGe regions 122.

Figure 1E:
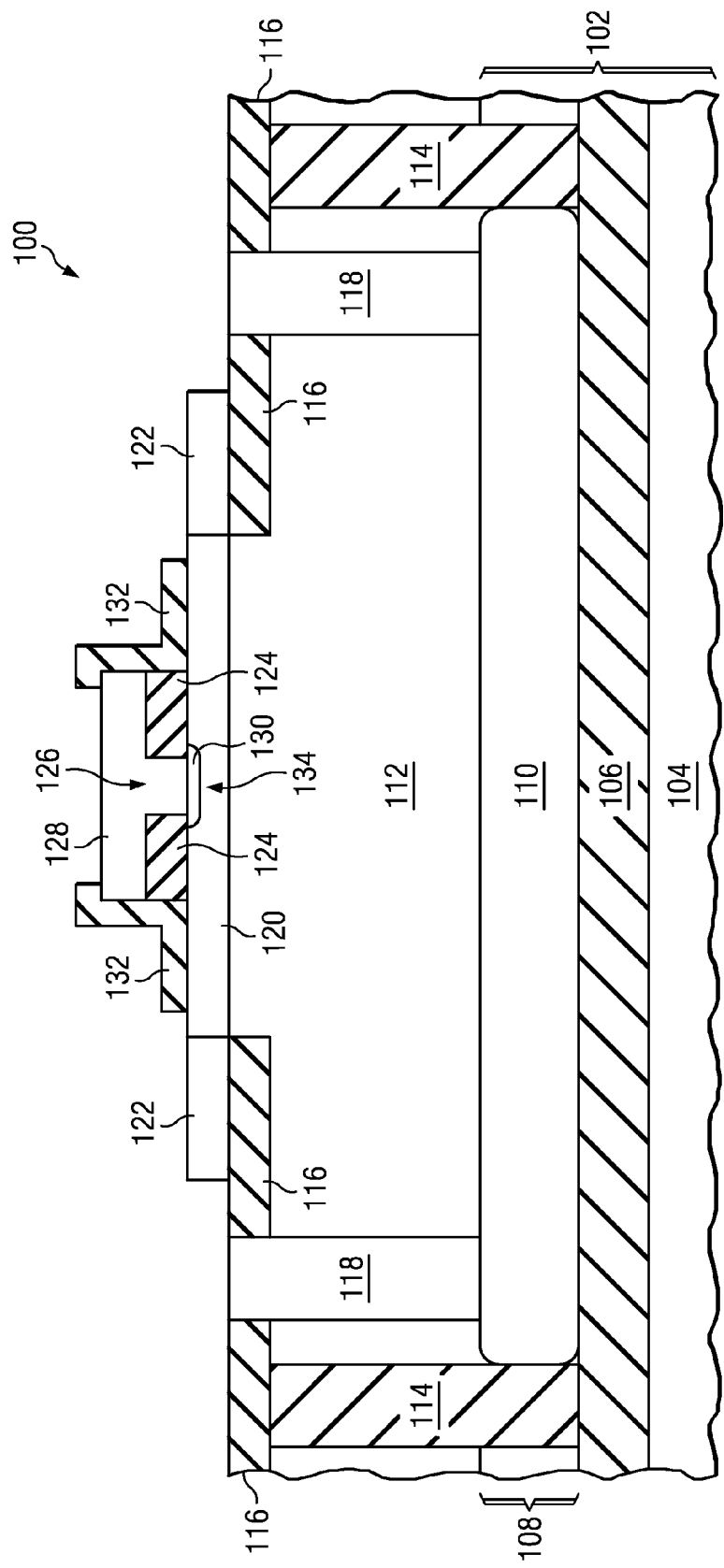

FIG. 1E depicts the IC 100 at a further stage of fabrication. ICs with bipolar transistors typically include a dielectric layer known as a silicide block layer which is formed in regions on top surfaces of silicon, SiGe or polysilicon to prevent formation of metal silicide in subsequent process operations. Silicide block layers are typically silicon nitride, silicon dioxide or a stack of silicon dioxide and silicon nitride, e.g., 10 to 200 nanometers thick, usually deposited by plasma enhanced chemical vapor deposition (PECVD). Silicide block elements are defined by patterning with photoresist and etching to remove unwanted silicide block layer material. In the instant embodiment, silicide block extrinsic base extenders 132 are formed around and overlapping the emitter silicon 128 and extending onto the top surface of the SiGe base layer 120. In a preferred embodiment, the silicide block extrinsic base extenders 132 do not overlap the polycrystalline SiGe regions 122 of the base, in order to reduce base current through the interface between the SiGe base layer 120 and the polycrystalline SiGe regions 122. In another embodiment, however, the silicide block extrinsic base extenders 132 may overlap the polycrystalline SiGe regions 122.

Figure 1F:
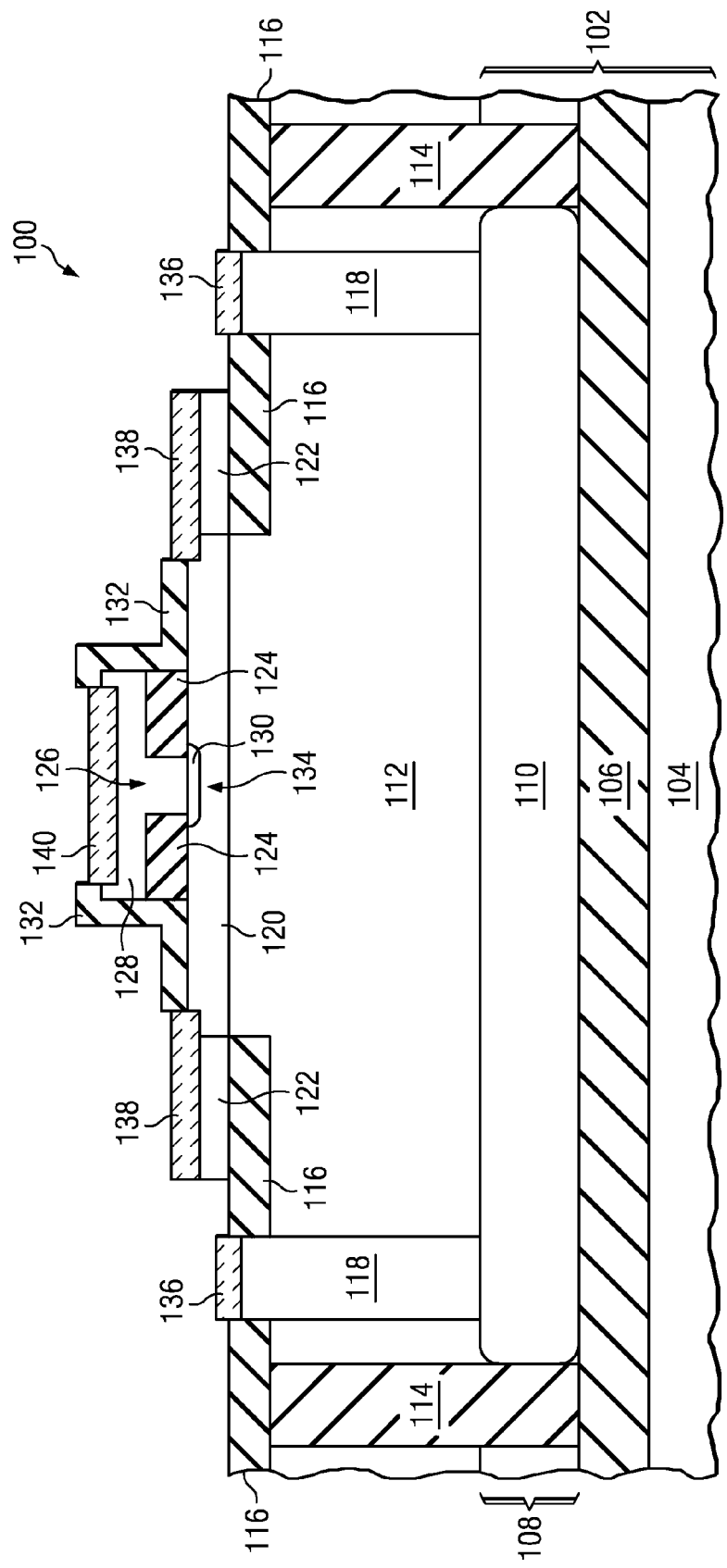

FIG. 1F depicts the IC 100 after formation of metal silicide on exposed surfaces of the silicon, SiGe and polysilicon elements. Metal silicide (e.g., nickel silicide, cobalt silicide, titanium silicide or, less commonly, platinum silicide) may be formed by depositing a corresponding refractory metal (e.g., nickel, cobalt, titanium, or platinum) on a top surface of an IC, followed by an optional cap layer. The IC is heated to react the refractory metal with exposed silicon, SiGe and polysilicon surfaces to form a region of metal silicide. The details of silicide formation processes may vary according to which metal is used to form the metal silicide. Refractory metal on dielectric surfaces, such as silicon dioxide and silicon nitride, typically reacts very little with the dielectric during silicide formation. Subsequent process steps selectively remove unwanted refractory metal from the dielectric surfaces. The optional cap layer is also removed. The IC 100 may be put through another thermal cycle to optimize properties (such as electrical resistivity) of the metal silicide. Metal silicide layers 136, 138 and 140 respectively define contacts to a collector, a base and an emitter of an NPN high-voltage bipolar transistor. The silicide block extrinsic base extenders 132 provide lateral separation between an emitter-base junction 134 and an interface between the SiGe base layer 120 and the base silicide contact 138, without adding significant capacitance between the emitter silicon 128 and the base 120.

The emitter comprises the emitter silicon 128 and the doped emitter region 130. The single crystal SiGe region immediately under the emitter-base junction 134 forms an intrinsic base region, and an extrinsic base includes single crystal SiGe around the intrinsic base region and includes a portion of the polycrystalline SiGe base layer 122. The collector comprises the n-type sinkers 118, n-type buried layer 110 and the n-epitaxial layer 112.

During high collector current density operation of the NPN high voltage bipolar transistor, a collector depletion region extends downward into the n-type epitaxial layer 112 under the SiGe single crystal base layer 120, and laterally toward the SiGe polycrystalline base layers 122. As the collector current density increases, a charge density from the collector current becomes substantially equal to an ionized donor charge density in the collector depletion region, and the effective base region is widened, resulting in undesirable diversion of emitter current to the base instead of the collector, which is manifested as a reduction in gain of the bipolar transistor. Lateral separation of the emitter-base junction 134 from the interface between the SiGe base layer 120 and the SiGe base elements 122 and lateral separation of the emitter-base junction 134 from the base contact silicide layer 138 are advantageous because the widened base region does not encompass recombination sites at the interface between the SiGe base layer 120 and the SiGe base elements 122 and at an interface between the base contact silicide layer 138 and the SiGe base layer 120, and thus excess base current is avoided, which desirably maintains the transistor gain at the high collector current density. The instant embodiment is furthermore advantageous in that a capacitance between the emitter silicon 128 and the base 120 is not substantially increased compared to configurations which have no lateral separation of the emitter-base junction 134 from the interface between the SiGe base layer 120 and the SiGe base elements 122. The use of silicide block layer material to form the extended base extrinsic region is advantageous in that a silicide block layer deposition and patterning process sequence is typically part of a fabrication process sequence for ICs that include high voltage bipolar transistors, for example to form polysilicon resistors, and thus a need for a separate photolithographic process step to define the extended base extrinsic region is eliminated, which would otherwise add cost and complexity to the IC fabrication process sequence. In the instant embodiment, the lateral separation between the emitter-base junction 134 and the interface between the SiGe base layer 120 and the SiGe base elements 122 is made greater than 1 micron, which may add a factor of 5 to a collector current density limit before reduction of the gain (for example, a 10 percent reduction) occurs. In another embodiment, the lateral separation between the emitter-base junction 134 and the interface between the SiGe base layer 120 and the SiGe base elements 122 may be made greater than 2 microns, which may add a factor of 10 to the collector current density limit before 10 percent reduction of the gain occurs.

Figure 1G:
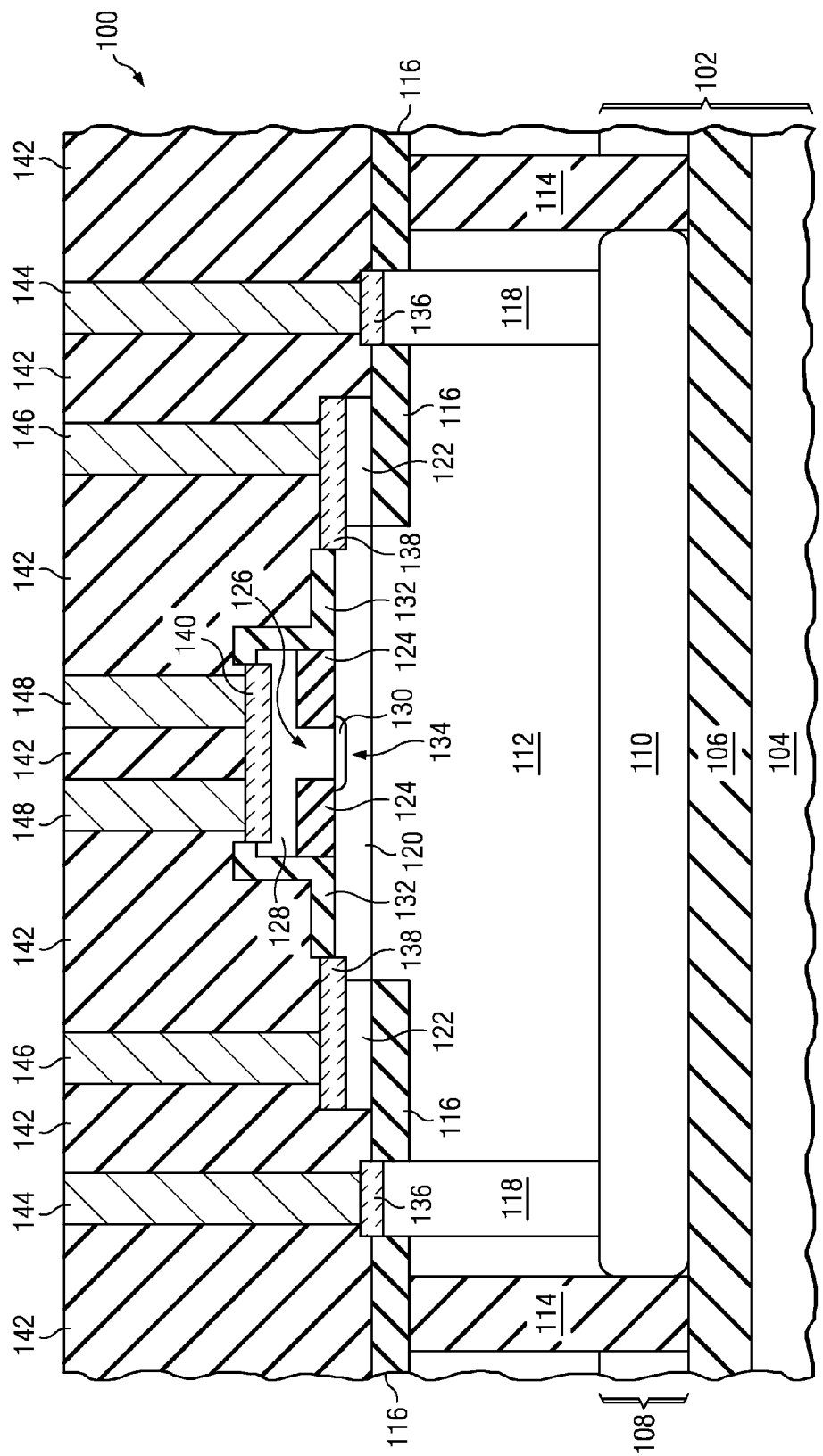

FIG. 1G depicts the IC 100 after first interconnect elements have been formed. A pre-metal dielectric (PMD) layer 142 is formed on a top surface of the bipolar transistor. The PMD layer 142 may, e.g., be a composite dielectric layer stack including a silicon nitride PMD liner of 10 to 100 nanometers thickness deposited by PECVD; a layer of silicon dioxide, phosphosilicate glass (PSG) or borophosphosilicate glass (BPSG) of 100 to 1000 nanometers thickness deposited by PECVD, leveled by a chemical-mechanical polishing (CMP) process; and an optional PMD cap layer of 10 to 100 nanometers thickness of a hard material such as silicon nitride, silicon carbide nitride or silicon carbide. Contacts are formed in the PMD layer 142 to connect the elements of the bipolar transistor to other components in the IC 100, such as by defining regions for contacts with a photoresist pattern, etching the portions of the PMD layer 142 left uncovered by the photoresist pattern to form contact holes that expose the metal silicide in the contact regions, and filling the contact holes with metal (e.g., tungsten) by depositing metal in the contact holes and over the unetched portions of the PMD layer 142. This is followed by selective removal of the surplus metal from above the top surface of the PMD layer 142, such as by etching and/or CMP processes. In this manner, collector contacts 144 are formed to connect to the collector contact silicide regions 136, base contacts 146 are formed to connect to the base contact silicide regions 138, and emitter contacts 148 are formed to connect to the emitter contact silicide region 140. In further process operations, levels of metal interconnects are formed to electrically connect the transistor through the contacts 144, 146, 148 to other components formed in the IC 100.

The advantages of principles of the invention may also be obtained in ICs which do not utilize a silicide block layer in their fabrication process sequence. FIGS. 2A-2E are cross-sectional views of an IC including another example embodiment of a bipolar transistor fabricated in accordance with principles of the invention.

Figure 2A:
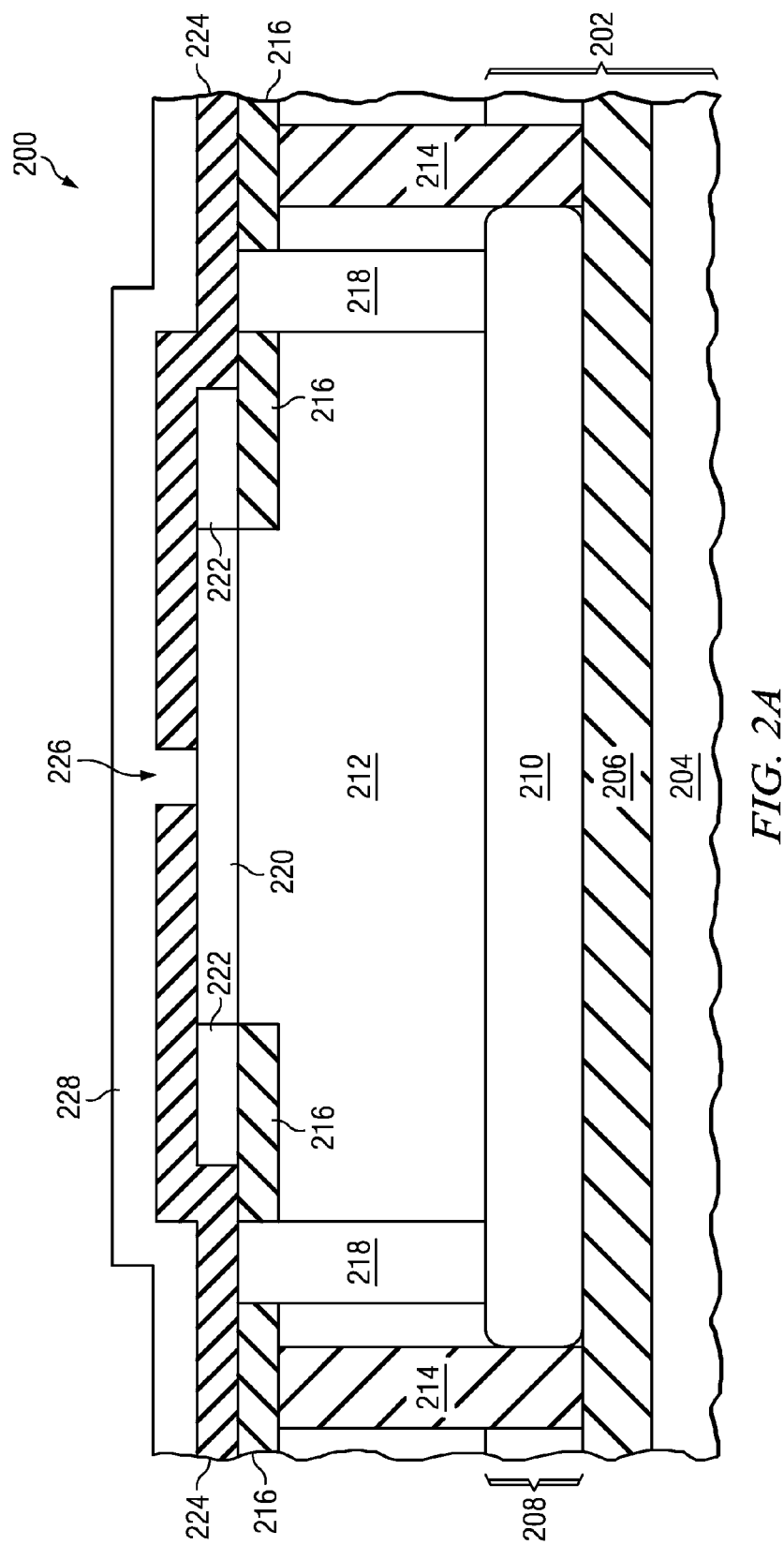
FIGS. 2A-2E are cross-sectional views of an IC including another example embodiment of a bipolar transistor fabricated in accordance with principles of the invention.

FIG. 2A illustrates an example IC 200 brought to a stage of fabrication analogous to that illustrated and described for IC 100 with reference to FIG. 1C. Processes and parameters used in the fabrication of IC 200 through the stage of fabrication illustrated in FIG. 2A may be the same as those used in the fabrication of IC 100 through the stage of fabrication illustrated in FIG. 1C.

As previously described for IC 100, the IC 200 is fabricated on a starting wafer 202, which includes a support wafer 204, a buried oxide layer 206 formed over the support wafer 204, and a single crystal SOI film 208 formed over the buried oxide layer 206. As with IC 100 (see FIG. 1C), the IC 200 shown in FIG. 2A has an n-type buried layer 210 formed, e.g., by ion implantation of n-type dopants into the SOI layer 208 followed by an anneal and growth of an n-type epitaxial layer 212, with a doping density of the doped epitaxial layer 212 determined by the intended operating voltage of the bipolar transistor. Deep trench isolation regions 214 are formed in the epitaxial layer 212 and SOI layer 208 to electrically isolate components in the IC 200. Regions of field oxide 216 are formed in a top portion of the epitaxial layer 212 to further electrically isolate elements in the IC 200. Deep n-type sinkers 218 are formed by multiple implantations of phosphorus and arsenic, followed by anneals, to connect the buried n-type layer 210 to a contacting top n-type layer formed in a subsequent step. A layer of SiGe is formed on a top surface of the IC 200 and is patterned with photoresist and etched to remove unwanted SiGe, for example, over the n-type sinkers 218. The SiGe is doped with p-type dopant to serve as a base for the bipolar transistor of IC 200. An emitter-base dielectric stack 224 is formed over the SiGe base layer 220, 222. An emitter opening 226 is formed in the emitter-base dielectric stack 224, and an n-type emitter silicon layer 228 is formed within the emitter opening 226 and over the emitter-base dielectric stack 224.

Figure 2B:
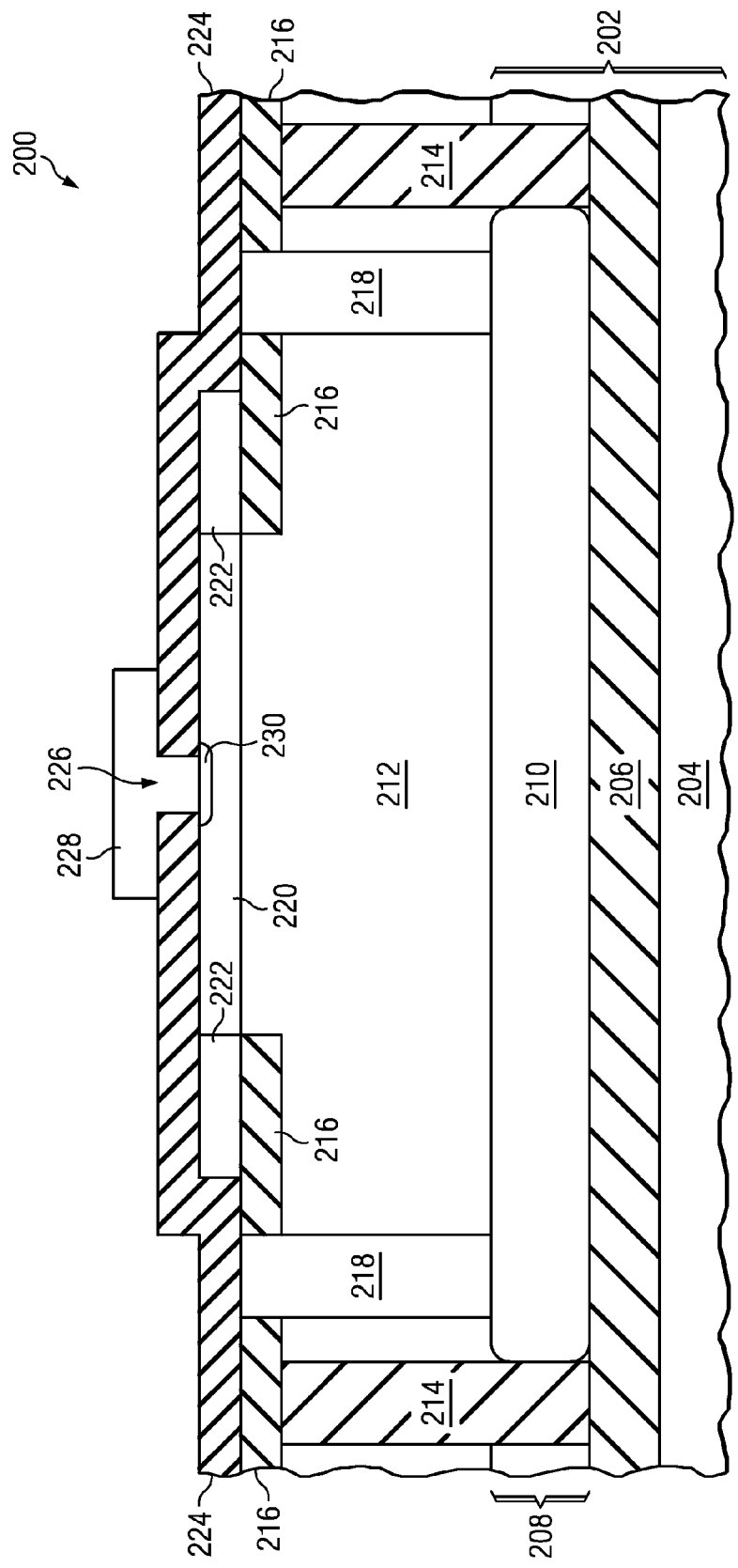

Referring to FIG. 2B, fabrication of the IC 200 continues with definition of an emitter silicon region by forming a photoresist layer on a top surface of the emitter silicon layer 228 and etching to remove unwanted portions of the emitter silicon layer 228. In departure from the previously described embodiment, the emitter-base dielectric stack 224 material is not substantially removed in this etch step, and lateral contours of the remaining emitter silicon layer 228 and emitter-base dielectric stack 224 are not made the same. An n-type single crystal emitter 230 is formed in the SiGe base layer 220 by performing a thermal process which diffuses n-type dopants from the emitter silicon layer 228 into the single crystal SiGe base layer 220. In other embodiments, the thermal process to form the n-type single crystal emitter 230 may be performed at other points in the fabrication process sequence.

Figure 2C:
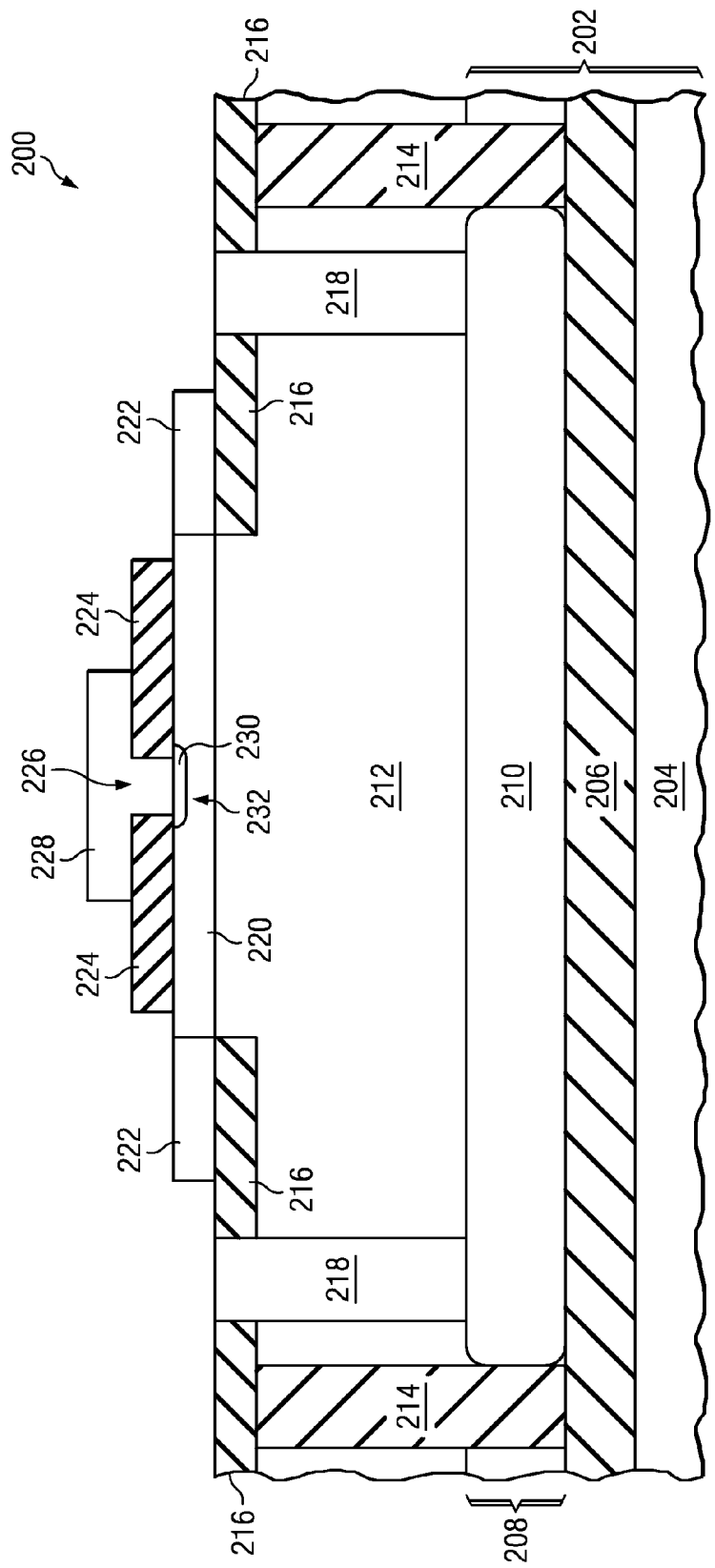

FIG. 2C depicts the IC 200 at a subsequent stage of fabrication. An extended base extrinsic region is defined by a photoresist pattern and emitter-base dielectric stack 224 material is removed by an etch process to expose the base layer 222, and a portion of the base layer 220. In this embodiment, lateral contours of the emitter-base dielectric stack 224 extend past the lateral contours of the emitter silicon 228. The extended emitter-base dielectric stack 224 provides lateral separation between an emitter-base junction 232 and an interface between the SiGe base layer 220 and the SiGe base elements 222, without adding significant capacitance between the emitter silicon 228 and the base 220.

Figure 2D:
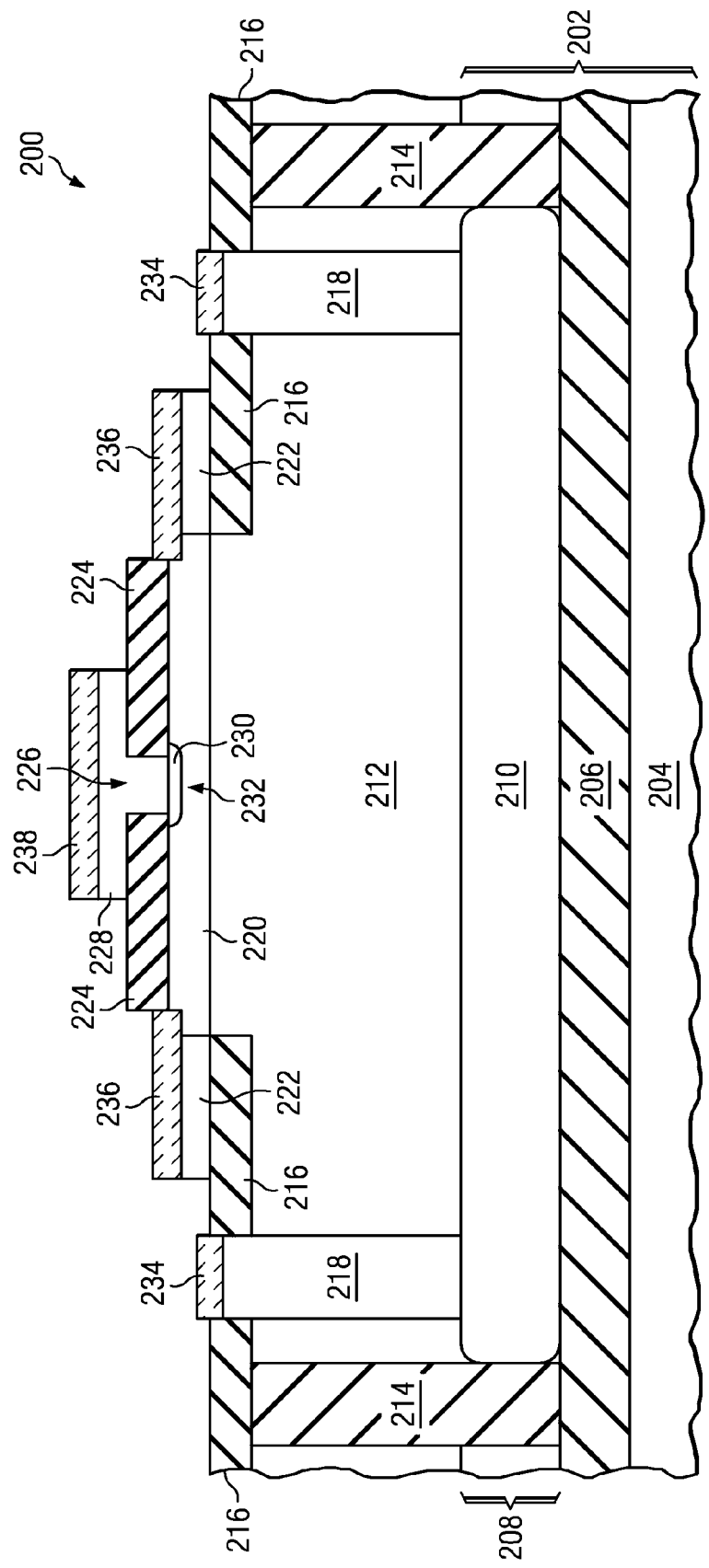

FIG. 2D depicts the IC 200 after formation of metal silicide on exposed surfaces of the silicon, SiGe and polysilicon elements of the IC 200. The silicide may be performed similarly to the silicide formation described previously for the formation of silicide with IC 100. Metal silicide layers 234, 236 and 238 are, respectively, the contacts to a collector, a base and an emitter of a NPN high-voltage bipolar transistor. The emitter comprises the emitter silicon 228 and the single-crystal emitter region 230. The single crystal SiGe region immediately under the emitter-base junction 232 forms an intrinsic base region, and an extrinsic base includes single crystal SiGe around the intrinsic base region and includes a portion of the polycrystalline SiGe base 222. The collector comprises the n-type sinkers 218, n-type buried layer 210 and n-epitaxial layer 212.

During high collector current density operation of the NPN high voltage bipolar transistor, a collector depletion region extends downward into the n-type epitaxial layer region 212 under the SiGe base layer 220 and laterally toward the SiGe base regions 222. As the collector current density increases, a charge density from the collector current becomes substantially equal to an ionized donor charge density in the collector depletion region, and the effective base region is widened resulting in undesirable diversion of emitter current to the base instead of the collector, which is manifested as a reduction in gain of the NPN high voltage bipolar transistor. Lateral separation of the emitter-base junction 232 from the interface between the SiGe base layer 220 and the SiGe base elements 222 by the extended emitter-base dielectric layer stack 224 and lateral separation of the emitter-base junction 232 from the base contact silicide layer 236 are advantageous because the widened base region does not encompass recombination sites at the interface between the SiGe base layer 220 and the SiGe base elements 222 and at an interface between the base contact silicide layer 236 and the SiGe base layer 220, and thus excess base current is avoided, which desirably maintains the transistor gain at the high collector current density. The instant embodiment is furthermore advantageous in that a capacitance between the emitter silicon 228 and the base 220 is not substantially increased compared to configurations which have no lateral separation of the emitter-base junction 232 from the interface between the SiGe base layer 220 and the SiGe base elements 222. As with IC 100, in the instant embodiment, the lateral separation between the emitter-base junction 232 and the interface between the SiGe base layer 220 and the SiGe base elements 222 may be made greater than 1 micron, which may add a factor of 5 to a collector current density limit before reduction of the gain (for example, 10 percent reduction) occurs. Likewise, in a further embodiment, the lateral separation between the emitter-base junction 232 and the interface between the SiGe base layer 220 and the SiGe base elements 222 may be made greater than 2 microns, which may add a factor of 10 to the collector current density limit before 10 percent reduction of the gain occurs.

Figure 2E:
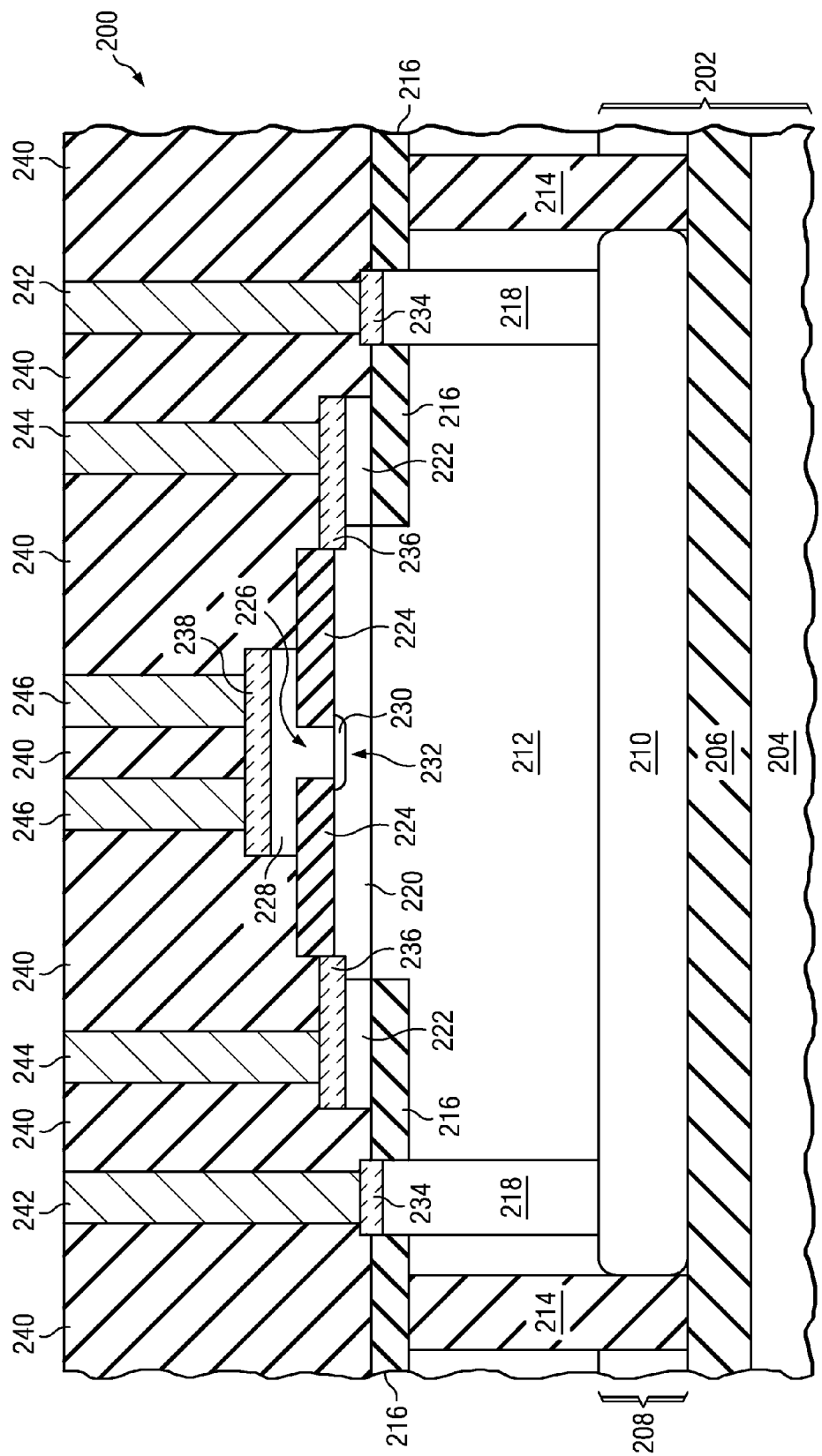

FIG. 2E depicts the IC 200 after first interconnect elements have been formed, which may be done in a way analogous to the formation of the corresponding elements for IC 100, described above. A PMD layer 240, such as the previously described dielectric layer stack, may include a silicon nitride PMD liner, a layer of silicon dioxide, PSG or BPSG, and an optional PMD cap layer of hard material such as silicon nitride, silicon carbide nitride or silicon carbide. Contacts are formed in the PMD layer to connect to the bipolar transistor and other components in the IC 200, as previously described in connection with IC 100. In this manner, collector contacts 242 are formed to connect to the collector contact silicide regions 234, base contacts 244 are formed to connect to the base contact silicide region 236, and emitter contacts 246 are formed to connect to the emitter contact silicide regions 238. In further process operations, levels of metal interconnects are formed to electrically connect the transistor t through the contacts of other components in the IC 200.

The advantages of the embodiments discussed above will also be realized in a high voltage bipolar transistor in which the base layer is formed of epitaxial silicon, instead of epitaxial SiGe.

The advantages of the embodiments discussed above may be realized in a PNP high voltage bipolar transistor, fabricated with appropriate changes in polarities of dopants.

Other means of laterally separating an emitter-base junction from regions of a high density of recombination sites in a base without increasing a capacitance between an emitter and the base in a bipolar transistor are within the scope of the instant invention.

Those skilled in the art to which the invention relates will appreciate that there are many other embodiments and modifications of embodiments within the scope of the claimed invention.

What is claimed is:

1. A method of forming an integrated circuit, comprising:
providing a semiconductor substrate;
forming a buried layer of n or p conductivity type in the semiconductor substrate;
forming an epitaxial layer of semiconductor material of the same n or p conductivity type over the buried layer; the epitaxial layer and the buried layer defining a collector of a bipolar transistor;
forming regions of field oxide in a top portion of the epitaxial layer, but not a bottom portion of the epitaxial layer;
forming a base layer of opposite n or p conductivity type over the epitaxial layer including over at least part of the field oxide regions; the base layer defining a base of the bipolar transistor;
forming a dielectric layer over the base layer;
patterning the dielectric layer to define an emitter opening;
forming an emitter layer of same n or p conductivity type semiconductor material over the dielectric layer and within the emitter opening;
patterning the emitter layer to remove the emitter layer overlying the field oxide regions and to remove at least part of the emitter layer overlying the base layer not overlying the field oxide portions,
forming a silicide block layer over the patterned emitter layer; and patterning the silicide block layer to form monolithic silicide blocking structures around and overlapping the patterned emitter layer and extending onto the base layer;
wherein the silicide blocking structures are patterned to expose the base layer overlying the at least part of the field oxide regions;
doping the base layer through the emitter opening to form an emitter-base junction region of the same n or p conductivity type in the base layer; the emitter-base junction region being laterally spaced from the at least part of the field oxide regions; and the emitter layer and emitter-base junction region defining an emitter of the bipolar transistor; and
forming at least one base contact region over the base layer, in a position laterally spaced from the emitter-base junction region.

2. The method of claim 1, further comprising patterning the dielectric layer to remove the dielectric layer overlying the field oxide regions and to remove at least a part of the dielectric layer overlying the base layer not overlying the field oxide portions.

3. The method of claim 2, wherein the emitter layer and dielectric layer are patterned to have substantially the same lateral contours.

4. The method of claim 2, wherein the emitter layer and dielectric layer are patterned so that lateral contours of the dielectric layer extend past lateral contours of the emitter layer.

5. The method of claim 1, further comprising forming metal silicide to define an emitter contact over the patterned emitter layer and to define the at least one base contact region over the exposed base layer overlying the at least part of the field oxide regions.

6. The method of claim 1, wherein doping the base layer through the emitter opening comprises performing a thermal process which causes dopants from the emitter layer to diffuse into the base layer.

7. The method of claim 1, wherein the base layer comprises a layer of SiGe formed by an epitaxial growth process in which single crystal SiGe is grown on the epitaxial layer of semiconductor material and polycrystalline SiGe is grown on the field oxide regions.

8. The method of claim 1, wherein the emitter-base junction is laterally spaced from the at least part of the field oxide regions by greater than 1 micron.

9. The method of claim 8, wherein the emitter-base junction is laterally spaced from the at least part of the field oxide regions by greater than 2 microns.

10. A method of forming an integrated circuit, comprising:
providing a semiconductor substrate including a support wafer, a buried oxide layer formed over the support wafer, and a silicon layer formed over the buried oxide layer;
forming a buried layer of n or p conductivity type by ion implantation into the silicon layer;
forming an epitaxial layer of semiconductor material of the same n or p conductivity type over the buried layer; the epitaxial layer and the buried layer of n or p conductivity type defining a collector of a bipolar transistor;
forming deep trench isolation regions of same n or p conductivity type in the epitaxial layer of semiconductor material and in the silicon layer to define sinkers extending from the top of the epitaxial down to the buried layer of n or p conductivity type;
forming regions of field oxide in a top portion of the epitaxial layer of semiconductor material; but not a bottom portion of the epitaxial layer;
forming a base layer of opposite n or p conductivity type over the epitaxial layer of semiconductor material including over at least part of the field oxide regions; the base layer comprising a layer of SiGe formed by an epitaxial growth process in which single crystal SiGe is grown on the epitaxial layer of semiconductor material and polycrystalline SiGe is grown on the field oxide regions; and the base layer defining a base of the bipolar transistor;
forming an emitter-base dielectric stack comprising at least one dielectric layer over the base layer;
patterning the dielectric stack to define an emitter opening;
forming an emitter layer of same n or p conductivity type silicon over the dielectric stack and within the emitter opening;
doping the base layer through the emitter opening to form an emitter-base junction region of the same n or p conductivity type in the base layer; the emitter-base junction region being laterally spaced from the at least part of the field oxide regions; and the emitter layer and emitter-base junction region defining an emitter of the bipolar transistor;
patterning the emitter layer and the dielectric stack to remove the emitter layer and dielectric stack overlying the field oxide regions and to remove at least part of the emitter layer and the dielectric stack overlying the base layer not overlying the field oxide portions; and
forming collector, base and emitter contacts respectively over the deep trench isolation regions, over the base layer over the at least part of the field oxide regions, and over the patterned emitter layer; and
wherein the collector, base and emitter contacts are formed by a siliciding process; and the method further comprises, prior to the siliciding process, forming a silicide block layer over the patterned emitter layer, and patterning the silicide block layer to form silicide blocking structures around and overlapping the patterned emitter layer and extending onto the base layer.

11. The method of claim 10, wherein the emitter layer and dielectric stack are patterned to have substantially the same lateral contours.

12. The method of claim 10, wherein the emitter layer and dielectric stack are patterned so that lateral contours of the dielectric layer extend past lateral contours of the emitter layer.

13. The method of claim 10, wherein the emitter-base junction is laterally spaced from the at least part of the field oxide regions by greater than 1 micron.

14. The method of claim 10, wherein doping the base layer through the emitter opening comprises performing a thermal process which causes dopants from the emitter layer to diffuse into the base layer.

15. A method of forming an integrated circuit, comprising:
providing a semiconductor substrate starting wafer;
forming a buried oxide layer on the support wafer;
forming a silicon layer over the buried oxide layer;
forming an n-type buried layer in the silicon layer by implantation of n-type dopants;
forming an n-type epitaxial growth layer over the silicon layer; the epitaxial growth layer and the n-type buried layer defining a collector of a bipolar transistor;
forming regions of deep trench isolation in the epitaxial growth layer and the silicon layer;
forming regions of field oxide in a top portion of the epitaxial growth layer; but not a bottom portion of the epitaxial layer;
forming deep n-type regions by implantation to define sinker connections through the epitaxial growth layer and the silicon layer to the n-type buried layer;
forming a p-type base layer of SiGe over the epitaxial growth layer including over at least part of the field oxide regions, the base layer defining a base of the bipolar transistor;
patterning the base layer to remove the base layer from over the sinker connections;
forming an emitter-base dielectric stack over the base layer;
patterning the emitter-base dielectric stack to define an emitter opening;
forming an n-type emitter silicon layer over the emitter-base dielectric stack and within the emitter opening;
forming an n-type emitter-base junction region in the base layer by a thermal process which causes n-type dopants from the emitter silicon layer to diffuse into the base layer through the emitter opening; the emitter-base junction region being laterally spaced from the at least part of the field oxide regions; and the emitter silicon layer and emitter-base junction regions defining an emitter of the bipolar transistor;
patterning the emitter silicon layer and the emitter-base dielectric stack to remove the emitter layer and dielectric stack overlying the field oxide regions and to remove at least part of the emitter layer and the dielectric stack overlying the base layer not overlying the field oxide portions;
forming a silicide block layer over the patterned emitter silicon layer;
patterning the silicide block layer to form silicide blocking structures around and overlapping the patterned emitter silicon layer and extending onto the base layer; and forming silicided collector, base and emitter contacts respectively over the deep trench isolation regions, over the base layer over the at least part of the field oxide regions, and over the patterned emitter layer; the silicide blocking structures providing lateral separation between the emitter-base junction and the silicided base contact.

* * * * *